United States Patent
Ge

(10) Patent No.: US 11,342,542 B2
(45) Date of Patent: May 24, 2022

(54) MANUFACTURING METHOD OF DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Xiaoming Ge, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 144 days.

(21) Appl. No.: 16/978,695

(22) PCT Filed: Jul. 17, 2020

(86) PCT No.: PCT/CN2020/102661
§ 371 (c)(1),
(2) Date: Sep. 6, 2020

(87) PCT Pub. No.: WO2021/248630
PCT Pub. Date: Dec. 16, 2021

(65) Prior Publication Data
US 2021/0384478 A1    Dec. 9, 2021

(30) Foreign Application Priority Data

Jun. 9, 2020  (CN) .......................... 202010518594.0

(51) Int. Cl.
*H01L 51/56*    (2006.01)
*H01L 27/32*    (2006.01)
*H01L 51/52*    (2006.01)

(52) U.S. Cl.
CPC ............ *H01L 51/56* (2013.01); *H01L 27/323* (2013.01); *H01L 51/5246* (2013.01); *H01L 51/5293* (2013.01); *H01L 51/5281* (2013.01)

(58) Field of Classification Search
CPC .... H01L 51/5293; H01L 51/56; H01L 27/323
See application file for complete search history.

(56) References Cited

U.S. PATENT DOCUMENTS

2015/0109226 A1  4/2015  Kim
2017/0309843 A1  10/2017 Kim
(Continued)

FOREIGN PATENT DOCUMENTS

CN  107305906 A  10/2017
CN  107359185 A  11/2017
(Continued)

OTHER PUBLICATIONS

Machine translation, Bai, Chinese Pat. Pub. No. CN-110610970-A, translation date: Mar. 18, 2022, Espacenet, all pages. (Year: 2022).*
(Continued)

*Primary Examiner* — Victoria K. Hall
(74) *Attorney, Agent, or Firm* — The Roy Gross Law Firm, LLC; Roy Gross

(57) ABSTRACT

A manufacturing method of a display device is provided. The method includes following steps: providing a display module, a first optical adhesive layer, and a touch control structure layer, wherein the display module includes a light transmission region, and the first optical adhesive layer is provided with a first through-hole; attaching the first optical adhesive layer and the touch control structure layer onto the display module in sequence, wherein the first through-hole corresponds to the light transmission region; and using laser to cut a portion of the display module corresponding to the (Continued)

light transmission region to form a second through-hole corresponding to and connected to the first through-hole.

19 Claims, 6 Drawing Sheets

(56) References Cited

U.S. PATENT DOCUMENTS

| | | | |
|---|---|---|---|
| 2020/0006683 A1 | 1/2020 | Kim | |
| 2020/0194696 A1* | 6/2020 | Yug | H01L 51/0096 |
| 2020/0328373 A1* | 10/2020 | Huang | H04M 1/0266 |
| 2021/0005836 A1* | 1/2021 | Yee | H01L 51/5281 |
| 2021/0013454 A1* | 1/2021 | Xie | H01L 27/323 |
| 2021/0405446 A1* | 12/2021 | Yu | G02F 1/13338 |
| 2022/0029140 A1* | 1/2022 | Wu | H01L 51/56 |

FOREIGN PATENT DOCUMENTS

| | | | |
|---|---|---|---|
| CN | 109495624 A | 3/2019 | |
| CN | 110233167 A | 9/2019 | |
| CN | 110405362 A | 11/2019 | |
| CN | 110600516 A | 12/2019 | |
| CN | 110610970 A * | 12/2019 | ......... H01L 27/3225 |
| CN | 110687710 A | 1/2020 | |
| CN | 110922916 A | 3/2020 | |
| CN | 210296381 U | 4/2020 | |
| WO | 2020194843 A1 | 10/2020 | |

OTHER PUBLICATIONS

Machine translation, Duan, Chinese Pat. Pub. No. CN 110600516A, translation date: Apr. 12, 2022, Espacenet, all pages. (Year: 2022).*
Machine translation, Wang, Chinese Pat. Pub. No. CN 110233167A, translation date: Apr. 12, 2022, Espacenet, all pages. (Year: 2022).*

* cited by examiner

MANUFACTURING METHOD OF DISPLAY DEVICE

FIELD OF INVENTION

The present disclosure relates to the field of display technologies, and more particularly, to a manufacturing method of a display device.

BACKGROUND OF INVENTION

Following notch screens, "hole-punch" screens have become a mainstream of a new generation of full screens. In current manufacturing processes of "hole-punch" screens of flexible organic light-emitting diodes (OLEDs), laser cutting is usually used to cut display screens to achieve an objective of opening holes in the display screens. In addition, in order to realize under-screen cameras while also having touch control functions, laser cutting generally ends at an optical adhesive layer under a touch control structure.

Technical problem: since a substrate of the touch control structure is mainly polyethylene terephthalate (PET) in general, in order to prevent a touch control functional layer in the touch control structure from being damaged, a laser cutting energy is usually controlled under an ablation threshold value of PET. However, because an ablation threshold value of the optical adhesive is greater than the ablation threshold value of PET, a serious phenomenon of optical adhesive residues will be caused, thereby reducing a viewing angle range of cameras.

SUMMARY OF INVENTION

The present disclosure provides a manufacturing method of a display device to solve a problem of optical adhesive residues caused by laser cutting in a manufacturing process of "hole-punch" screens.

The present disclosure provides a manufacturing method of a display device. The method includes following steps:
providing a display module, a first optical adhesive layer, and a touch control structure layer, wherein the display module includes a light transmission region, the first optical adhesive layer is provided with a first through-hole, the display module includes an array substrate, a light-emitting functional layer, and a polarizer formed in sequence, and the polarizer is disposed on one side of the light-emitting functional layer adjacent to the first optical adhesive layer;
attaching the first optical adhesive layer and the touch control structure layer onto the display module in sequence, wherein the first through-hole corresponds to the light transmission region, and the touch control structure layer includes a substrate layer and a touch control functional layer formed in sequence; and
using laser to cut a portion of the display module corresponding to the light transmission region to form a second through-hole corresponding to and connected to the first through-hole.

In the manufacturing method of the display device according to the present disclosure, the step of providing the first optical adhesive layer includes:
cutting the first optical adhesive layer according to a shape and a size of the light transmission region to form the first optical adhesive layer having the first through-hole.

In the manufacturing method of the display device according to the present disclosure, wherein before or after the step of attaching the first optical adhesive layer and the touch control structure layer onto the display module in sequence, the manufacturing method includes following steps:
providing a backplate structure layer, wherein the backplate structure layer includes a backplate and an adhesive layer attached to the backplate;
forming a third through-hole on the backplate structure layer, wherein the third through-hole penetrates through the backplate and the adhesive layer; and
attaching the display module to the adhesive layer, wherein the third through-hole corresponds to the light transmission region.

In the manufacturing method of the display device according to the present disclosure, wherein the step of forming the third through-hole on the backplate structure layer includes following steps:
cutting the adhesive layer according to a shape and a size of the light transmission region to form a first sub-through-hole; and
cutting the backplate according to the shape and the size of the light transmission region to form a second sub-through-hole, wherein the second sub-through-hole is connected to the first sub-through-hole to form the third through-hole of the backplate structure layer.

In the manufacturing method of the display device according to the present disclosure, before or after the step of attaching the first optical adhesive layer and the touch control structure layer onto the display module in sequence, the manufacturing method includes following steps:
providing a backplate and an adhesive layer, wherein the adhesive layer is provided with a third through-hole;
attaching the adhesive layer and the display module to the backplate in sequence, wherein the third through-hole corresponds to the light transmission region; and
the step of using laser to cut the portion of the display module corresponding to the light transmission region includes:
using laser to cut a portion of the backplate and the display module corresponding to the light transmission region to form a fourth through-hole on the backplate and form the second through-hole on the display module, wherein the fourth through-hole is connected to the second through-hole.

In the manufacturing method of the display device according to the present disclosure, wherein before or after the step of attaching the first optical adhesive layer and the touch control structure layer onto the display module in sequence, the manufacturing method includes following steps:
providing a backplate structure layer, wherein the backplate structure layer includes a backplate and an adhesive layer attached to the backplate;
attaching the display module to the adhesive layer; and
the step of using laser to cut the portion of the display module corresponding to the light transmission region includes:
using laser to cut a portion of the backplate structure layer and the display module corresponding to the light transmission region to form a third through-hole on the backplate structure layer and form the second through-hole on the display module, wherein the second through-hole, the third through-hole, and the first through-hole are connected.

In the manufacturing method of the display device according to the present disclosure, the step of using laser to cut the portion of the display module corresponding to the light transmission region to form the second through-hole includes:

setting laser cutting parameters, wherein the laser cutting parameters include a laser cutting power, a laser cutting time, and a number of turns of laser cutting track; and cutting the portion of the display module corresponding to the light transmission region according to the laser cutting parameters to form the second through-hole.

In the manufacturing method of the display device according to the present disclosure, a material of the substrate layer includes polyethylene terephthalate.

In the manufacturing method of the display device according to the present disclosure, after the step of attaching the first optical adhesive layer and the touch control structure layer onto the display module in sequence, the manufacturing method further includes following steps:

forming a second optical adhesive layer on the touch control structure layer;

disposing a shading ring on the second optical adhesive layer, wherein the shading ring is coaxially arranged with the first through-hole; and forming a protective layer on the shading ring.

The present disclosure further provides a manufacturing method of a display device. The method includes following steps: providing a display module, a first optical adhesive layer, and a touch control structure layer, wherein the display module includes a light transmission region, and the first optical adhesive layer is provided with a first through-hole;

attaching the first optical adhesive layer and the touch control structure layer onto the display module in sequence, wherein the first through-hole corresponds to the light transmission region; and using laser to cut a portion of the display module corresponding to the light transmission region to form a second through-hole corresponding to and connected to the first through-hole.

In the manufacturing method of the display device according to the present disclosure, the step of providing the first optical adhesive layer includes:

cutting the first optical adhesive layer according to a shape and a size of the light transmission region to form the first optical adhesive layer having the first through-hole.

In the manufacturing method of the display device according to the present disclosure, before or after the step of attaching the first optical adhesive layer and the touch control structure layer onto the display module in sequence, the manufacturing method includes following steps:

providing a backplate structure layer, wherein the backplate structure layer includes a backplate and an adhesive layer attached to the backplate;

forming a third through-hole on the backplate structure layer, wherein the third through-hole penetrates through the backplate and the adhesive layer; and attaching the display module to the adhesive layer, wherein the third through-hole corresponds to the light transmission region.

In the manufacturing method of the display device according to the present disclosure, wherein the step of forming the third through-hole on the backplate structure layer includes following steps:

cutting the adhesive layer according to a shape and a size of the light transmission region to form a first sub-through-hole; and cutting the backplate according to the shape and the size of the light transmission region to form a second sub-through-hole, wherein the second sub-through-hole is connected to the first sub-through-hole to form the third through-hole of the backplate structure layer.

In the manufacturing method of the display device according to the present disclosure, before or after the step of attaching the first optical adhesive layer and the touch control structure layer onto the display module in sequence, the manufacturing method includes following steps:

providing a backplate and an adhesive layer, wherein the adhesive layer is provided with a third through-hole;

attaching the adhesive layer and the display module to the backplate in sequence, wherein the third through-hole corresponds to the light transmission region; and the step of using laser to cut the portion of the display module corresponding to the light transmission region includes:

using laser to cut a portion of the backplate and the display module corresponding to the light transmission region to form a fourth through-hole on the backplate and form the second through-hole on the display module, wherein the fourth through-hole is connected to the second through-hole.

In the manufacturing method of the display device according to the present disclosure, before or after the step of attaching the first optical adhesive layer and the touch control structure layer onto the display module in sequence, the manufacturing method includes following steps:

providing a backplate structure layer, wherein the backplate structure layer includes a backplate and an adhesive layer attached to the backplate;

attaching the display module to the adhesive layer; and the step of using laser to cut the portion of the display module corresponding to the light transmission region includes:

using laser to cut a portion of the backplate structure layer and the display module corresponding to the light transmission region to form a third through-hole on the backplate structure layer and form the second through-hole on the display module, wherein the second through-hole, the third through-hole, and the first through-hole are connected.

In the manufacturing method of the display device according to the present disclosure, the step of using laser to cut the portion of the display module corresponding to the light transmission region to form the second through-hole includes:

setting laser cutting parameters, wherein the laser cutting parameters include a laser cutting power, a laser cutting time, and a number of turns of laser cutting track; and cutting the portion of the display module corresponding to the light transmission region according to the laser cutting parameters to form the second through-hole.

In the manufacturing method of the display device according to the present disclosure, the touch control structure layer includes a substrate layer and a touch control functional layer formed in sequence, and a material of the substrate layer includes polyethylene terephthalate.

In the manufacturing method of the display device according to the present disclosure, after the step of attaching the first optical adhesive layer and the touch control structure layer onto the display module in sequence, the manufacturing method further includes following steps:

forming a second optical adhesive layer on the touch control structure layer;

disposing a shading ring on the second optical adhesive layer, wherein the shading ring is coaxially arranged with the first through-hole; and forming a protective layer on the shading ring.

In the manufacturing method of the display device according to the present disclosure, the display module includes an array substrate, a light-emitting functional layer, and a polarizer formed in sequence, and the polarizer is disposed on one side of the light-emitting functional layer adjacent to the first optical adhesive layer.

Beneficial effect: compared to manufacturing methods of display devices in current technology, the manufacturing method of the display device provided by the present disclosure pre-opens a first through-hole on a first optical adhesive layer, and then laminates a display module, the first optical adhesive layer, and a touch control structure layer in sequence. The first through-hole corresponds to a light transmission region, so when using laser to cut a portion of the display module corresponding to the light transmission region, a portion of the first optical adhesive layer corresponding to the light transmission region has the first through-hole, thereby effectively preventing optical adhesive residues caused by laser cutting, and ensures a viewing angle range of cameras.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
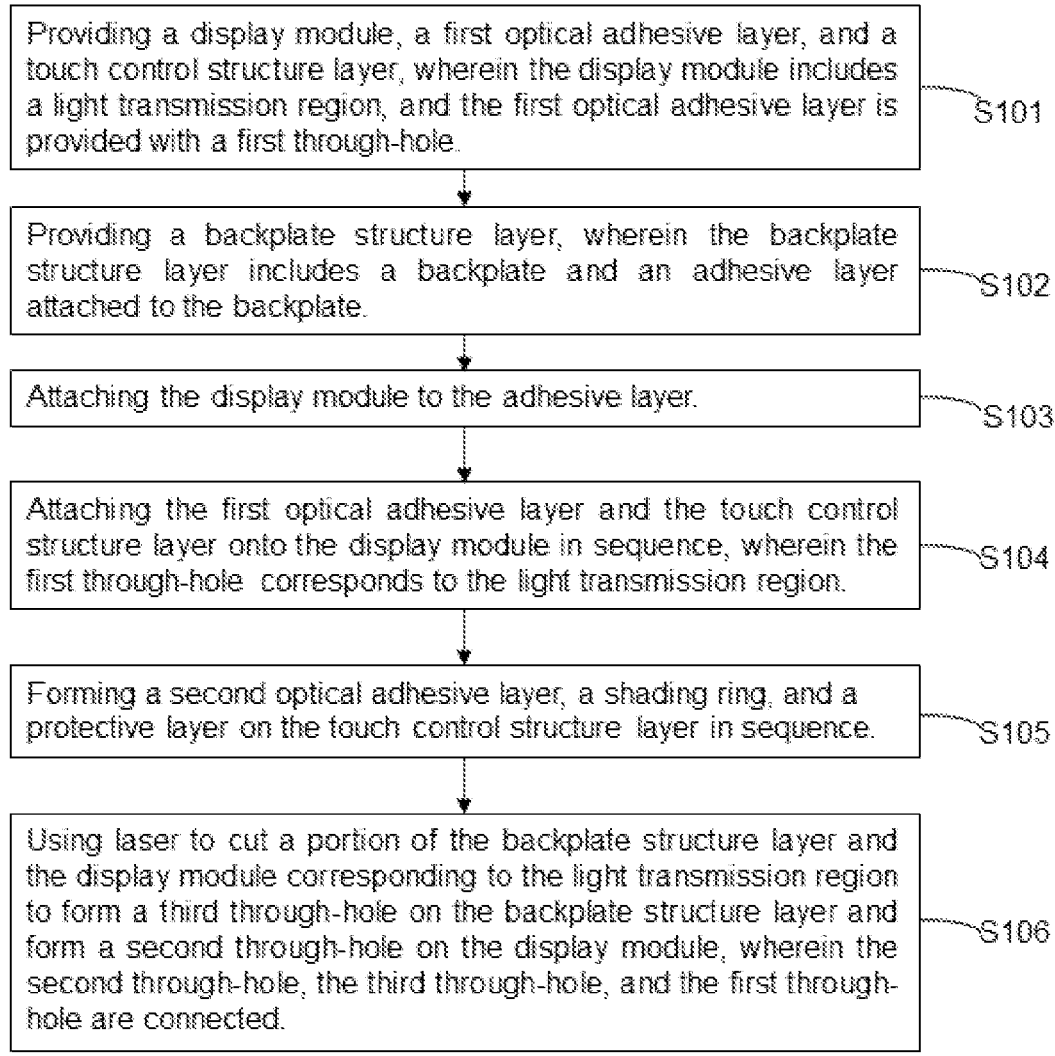
FIG. 1 is a flowchart of a manufacturing method of a display device according to embodiment 1 of the present disclosure.

The following will clearly and completely describe the technical solutions in the embodiments of the present disclosure with reference to the drawings in the embodiments of the present disclosure. Obviously, the described embodiments are only a part of embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicate the number of technical features indicated. Thus, features limited by "first" and "second" are intended to indicate or imply including one or more than one of these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrated connection; it can mean a mechanical connection, an electrical connection, or can communicate with each other; it can mean a direct connection, an indirect connection by an intermediary, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The following description provides many different embodiments or examples for implementing different structures of the present disclosure. In order to simplify the present disclosure, the components and settings of a specific example are described below. Of course, they are merely examples and are not intended to limit the present disclosure. In addition, the present disclosure may repeat reference numerals and/or reference letters in different examples, which are for the purpose of simplicity and clarity, and do not indicate the relationship between the various embodiments and/or arrangements discussed. In addition, the present disclosure provides examples of various specific processes and materials, but one of ordinary skill in the art will recognize the use of other processes and/or the use of other materials.

It should be noted that a display module in the present disclosure may be an organic light-emitting diode display module or a liquid crystal display module. The following embodiments of the present disclosure only take the organic light-emitting diode display module as an example for description, but is not limited to this.

Referring to FIG. 1, FIG. 1 is a flowchart of a manufacturing method of a display device according to embodiment 1 of the present disclosure.

Embodiment 1 of the present disclosure provides the manufacturing method of the display device, which includes following steps.

Step S101: providing a display module, a first optical adhesive layer, and a touch control structure layer. Wherein, the display module includes a light transmission region, and the first optical adhesive layer is provided with a first through-hole.

Step S102: providing a backplate structure layer. Wherein, the backplate structure layer includes a backplate and an adhesive layer attached to the backplate.

Step S103: attaching the display module to the adhesive layer.

Step S104: attaching the first optical adhesive layer and the touch control structure layer onto the display module in sequence. Wherein, the first through-hole corresponds to the light transmission region.

Step S105: forming a second optical adhesive layer, a shading ring, and a protective layer on the touch control structure layer in sequence.

Step S106: using laser to cut a portion of the backplate structure layer and the display module corresponding to the light transmission region to form a third through-hole on the backplate structure layer and form a second through-hole on the display module. Wherein, the second through-hole, the third through-hole, and the first through-hole are connected.

The manufacturing method of the display device provided by embodiment 1 of the present disclosure pre-opens the first through-hole on the first optical adhesive layer, and then laminates the backplate structure layer, the display module, the first optical adhesive layer, and the touch control structure layer in sequence. Therefore, when using laser to cut a portion of the backplate structure layer and the display module corresponding to the light transmission region, since a portion of the first optical adhesive layer corresponding to the light transmission region has the first through-hole, optical adhesive residues caused by laser cutting can be prevented, and a viewing angle range of cameras can be ensured.

It should be noted that the steps S102 and S103 of embodiment 1 may be before the step S104 or after the step S104, and embodiment 1 of the present disclosure only takes the steps S102 and S103 before the step S104 as an example for description, but it is not limited to this.

Figure 2:
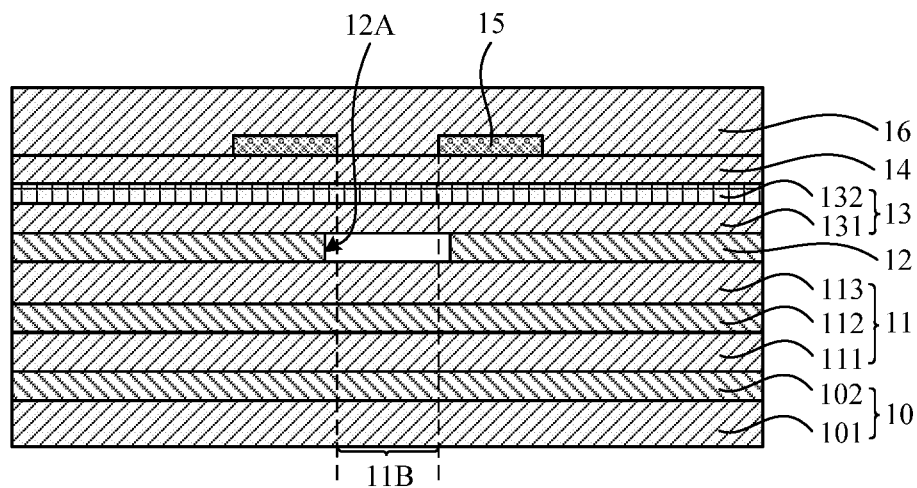
FIG. 2 is a schematic structural diagram of the display device obtained in a step S105 of the manufacturing method according to embodiment 1 of the present disclosure.
Figure 3:
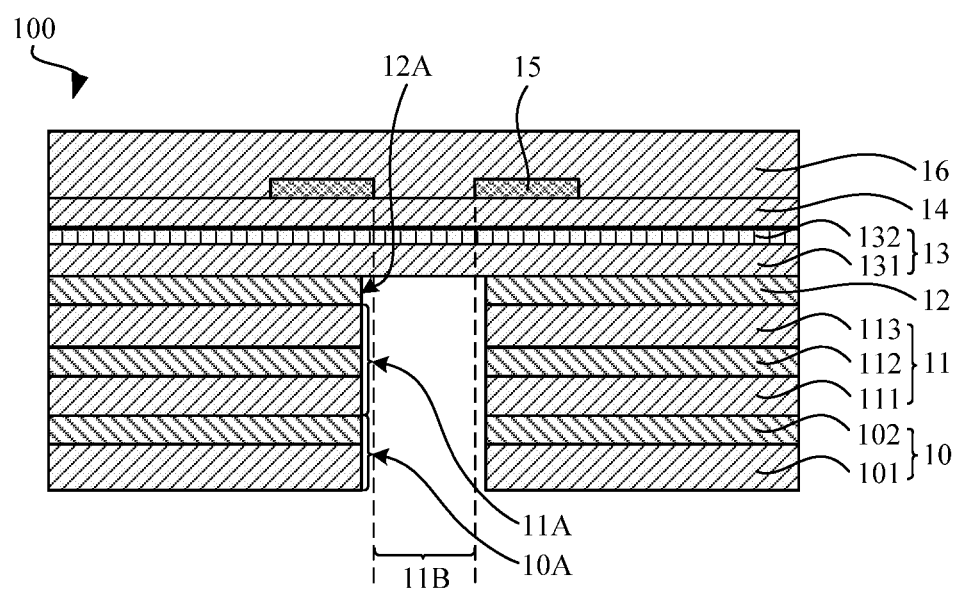
FIG. 3 is a schematic structural diagram of the display device obtained by the manufacturing method according to embodiment 1 of the present disclosure.

Referring to FIGS. 1 to 3, FIG. 2 is a schematic structural diagram of the display device obtained in the step S105 of the manufacturing method according to embodiment 1 of the present disclosure, and FIG. 3 is a schematic structural diagram of the display device obtained by the manufacturing method according to embodiment 1 of the present disclosure.

The manufacturing method of the display device 100 provided by embodiment 1 of the present disclosure will be described in detail below.

Step S101: providing the display module 11, the first optical adhesive layer 12, and the touch control structure layer 13. The display module 11 includes the light transmission region 11B. The first optical adhesive layer 12 is provided with the first through-hole 12A.

Specifically, the display module 11 includes an array substrate 111, a light-emitting functional layer 112, and a polarizer 113 formed in sequence. The polarizer 113 is disposed on one side of the light-emitting functional layer 112 adjacent to the first optical adhesive layer 12.

The touch control structure layer 13 includes a substrate layer 131 and a touch control functional layer 132 formed in sequence. A material of the substrate layer 131 includes polyethylene terephthalate. A material of the touch control functional layer 132 includes nano silver.

It can be understood that in current technology, during a process of opening holes on display screens using laser cutting, when a laser energy is greater than an ablation threshold value of polyethylene terephthalate, the substrate layer of a touch control structure is easily affected by laser and damaged, thereby affecting the touch control functional layer on the substrate layer. Since the touch control functional layer is thinner, touch control functions will be directly affected and lose effectiveness. Therefore, in order to prevent the substrate layer in the touch control structure layer from being damaged by the laser, the laser energy is generally set to be less than the ablation threshold value of polyethylene terephthalate.

However, since an ablation threshold value of optical adhesive is greater than the ablation threshold value of polyethylene terephthalate, when the first optical adhesive layer is cut by laser, a portion of the first optical adhesive layer corresponding to the light transmission region cannot be completely vaporized, thereby causing a hole-opening position of the first optical adhesive layer to have optical adhesive residues.

In response to the above technical problems, embodiment 1 of the present disclosure pre-opens the first through-hole 12A on the first optical adhesive layer 12. Therefore, when the laser having energy less than the ablation threshold value of polyethylene terephthalate is subsequently used to cut the portion of the backplate structure layer 10 and the display module 11 corresponding to the light transmission region 11B, since the portion of the first optical adhesive layer 12 corresponding to the light transmission region 11B is a hollowed-out structure, the optical adhesive residues caused by laser cutting can be effectively prevented, and the viewing angle range of cameras can be ensured.

Wherein, the step of providing the first optical adhesive layer 12 includes:

cutting the first optical adhesive layer 12 according to a shape and a size of the light transmission region 11B to form the first optical adhesive layer 12 having the first through-hole 12A.

Specifically, the first optical adhesive layer 12 is cut by laser cutting process or mechanical cutting process, thereby forming the first optical adhesive layer 12 having the first through-hole 12A. In embodiment 1, the first optical adhesive layer 12 having the first through-hole 12A is formed by the laser cutting process, which is beneficial for improving cutting accuracy, thereby preventing incomplete cutting and affecting lighting of the cameras. Then proceed to the step S102.

Step S102: providing the backplate structure layer 10. Wherein, the backplate structure layer 10 includes the backplate 101 and the adhesive layer 102 attached to the backplate 101.

Wherein, a substrate of the backplate 101 may be a flexible material or a rigid material. A material of the adhesive layer 102 is a pressure sensitive adhesive. Then proceed to the step S103.

Step S103: attaching the display module 11 to the adhesive layer 102.

Wherein, the array substrate 111 of the display module 11 is attached to the adhesive layer 102. Then proceed to the step S104.

Step S104: attaching the first optical adhesive layer 12 and the touch control structure layer 13 onto the display module 11 in sequence. Wherein, the first through-hole 12A corresponds to the light transmission region 11B.

Specifically, the first optical adhesive layer 12 and the touch control structure layer 13 are attached to the polarizer 113 of the display module 11 in sequence, and the first through-hole 12A is arranged corresponding to the light transmission region 11B. Then proceed to the step S105.

Step S105: forming the second optical adhesive layer 14, the shading ring 15, and the protective layer 16 on the touch control structure layer 13 in sequence, as shown in FIG. 2.

Specifically, the step S105 includes following steps:

Step S1051: forming the second optical adhesive layer 14 on the touch control structure layer 13.

Step S1052: disposing the shading ring 15 on the second optical adhesive layer 14. Wherein, the shading ring 15 is coaxially arranged with the first through-hole 12A. Specifically, an orthographic projection of the first through-hole 12A on a plane where the display module 11 is located is within an orthographic projection of the shading ring 15 on the plane where the display module 11 is located. Wherein, a material of the shading ring 15 may be light-shielding materials, such as a black ink or a light-shielding adhesive.

Step S1053: forming the protective layer 16 on the shading ring 15 to obtain a structure shown in FIG. 2. Wherein, a material of the protective layer 16 may be an organic material such as polyethylene terephthalate. Then proceed to the step S106.

Step S106: using laser to cut the portion of the backplate structure layer 10 and the display module 11 corresponding to the light transmission region 11B to form the third through-hole 10A on the backplate structure layer 10 and form the second through-hole 11A on the display module 11. Wherein, the second through-hole 11A, the third through-hole 10A, and the first through-hole 12A are connected, as shown in FIG. 3.

Specifically, the step S106 includes following steps:

Step S1061: setting laser cutting parameters. Wherein, the laser cutting parameters include a laser cutting power, a laser cutting time, and a number of turns of laser cutting track.

Step S1062: cutting the portion of the backplate structure layer 10 and the display module 11 corresponding to the light transmission region 11B according to the laser cutting parameters to form the third through-hole 10A on the backplate structure layer 10 and form the second through-hole 11A on the display module 11. Wherein, the second through-hole 11A, the third through-hole 10A, and the first through-hole 12A are connected.

Specifically, since the portion of the first optical adhesive layer 12 corresponding to the light transmission region 11B is pre-opened and provided with the first through-hole 12A, when the backplate structure layer 10 and the display module 11 are cut by laser, the laser beam can be ended at an interface between the polarizer 113 and the first optical adhesive layer 12 by settings of the laser cutting parameters, thereby controlling a laser cutting depth. In addition, since an area where the first through-hole 12A is located is a heat affected area during laser cutting, the substrate layer 131 on the first optical adhesive layer 12 can be further prevented from being damaged by the laser beam.

The manufacturing method of the display device 100 provided by embodiment 1 of the present disclosure pre-opens the first through-hole 12A on the first optical adhesive layer 12, and then laminates the backplate structure layer 10, the display module 11, the first optical adhesive layer 12, and the touch control structure layer 13 in sequence. Therefore, when using laser to cut a portion of the backplate structure layer 10 and the display module 11 corresponding to the light transmission region 11B, since the portion of the first optical adhesive layer 12 corresponding to the light transmission region 11B has the first through-hole 12A, the optical adhesive residues caused by laser cutting can be prevented, and the viewing angle range of the cameras can be ensured. In addition, the above settings can also realize control of the laser cutting depth, which further prevents the substrate layer 131 on the first optical adhesive layer 12 from being damaged by the laser beam.

Figure 4:
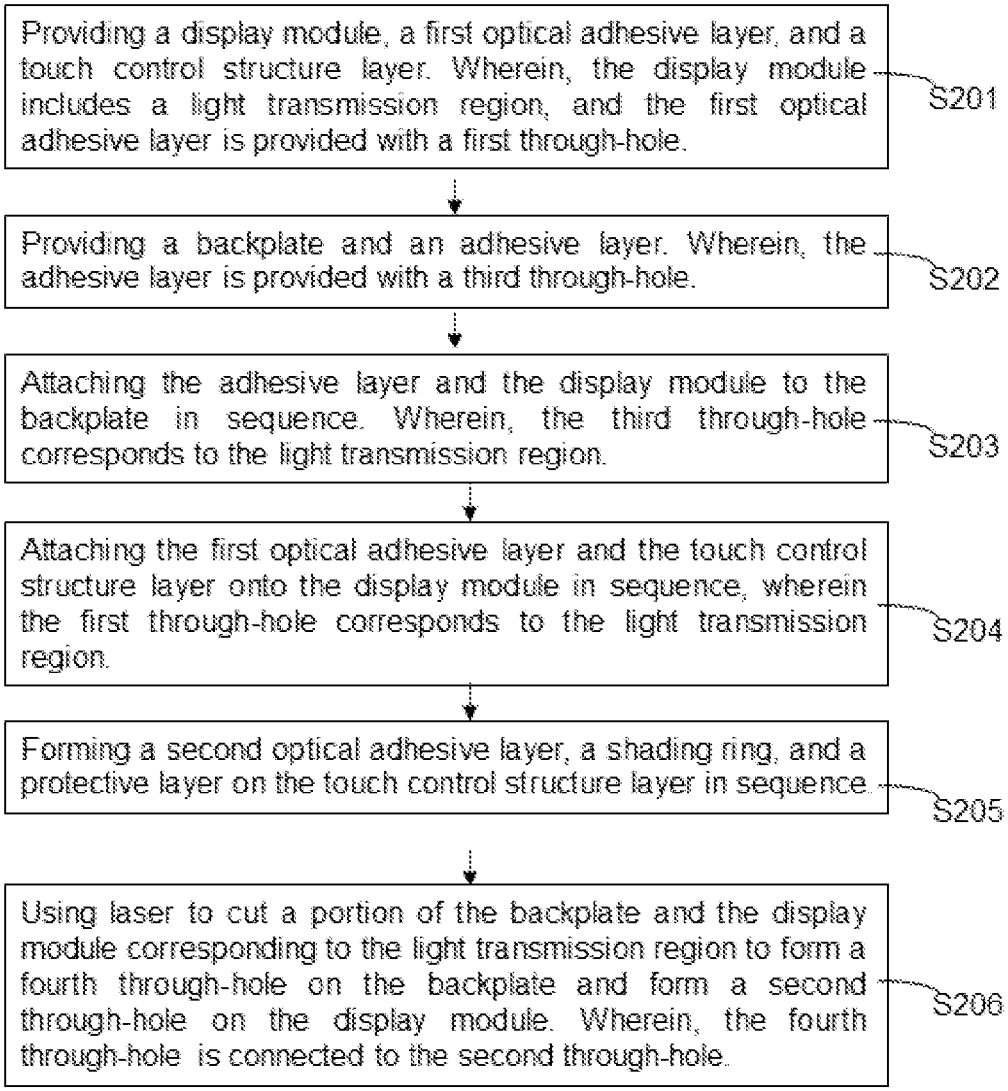
FIG. 4 is a flowchart of a manufacturing method of a display device according to embodiment 2 of the present disclosure.

Referring to FIG. 4, FIG. 4 is a flowchart of a manufacturing method of a display device according to embodiment 2 of the present disclosure.

Embodiment 2 of the present disclosure provides the manufacturing method of the display device, which includes following steps.

Step S201: providing a display module, a first optical adhesive layer, and a touch control structure layer. Wherein, the display module includes a light transmission region, and the first optical adhesive layer is provided with a first through-hole.

Step S202: providing a backplate and an adhesive layer. Wherein, the adhesive layer is provided with a third through-hole.

Step S203: attaching the adhesive layer and the display module to the backplate in sequence. Wherein, the third through-hole corresponds to the light transmission region.

Step S204: attaching the first optical adhesive layer and the touch control structure layer onto the display module in sequence. Wherein, the first through-hole corresponds to the light transmission region.

Step S205: forming a second optical adhesive layer, a shading ring, and a protective layer on the touch control structure layer in sequence.

Step S206: using laser to cut a portion of the backplate and the display module corresponding to the light transmission region to form a fourth through-hole on the backplate and form a second through-hole on the display module. Wherein, the fourth through-hole is connected to the second through-hole.

As such, the manufacturing method of the display device provided by embodiment 2 of the present disclosure pre-opens the first through-hole and the third through-hole respectively on the first optical adhesive layer and the adhesive layer, and then laminates the backplate, the adhesive layer, the display module, the first optical adhesive layer, and the touch control structure layer in sequence. Therefore, when using laser to cut a portion of the backplate and the display module corresponding to the light transmission region, since a portion of the first optical adhesive layer and the adhesive layer corresponding to the light transmission region respectively have the first through-hole and the third through-hole, optical adhesive residues and residues of adhesive materials in the adhesive layer caused by laser cutting can be prevented, and a viewing angle range of cameras can be ensured.

It should be noted that the steps S202 and S203 of embodiment 2 may be before the step S204 or after the step S204, and embodiment 2 of the present disclosure only takes the steps S202 and S203 before the step S204 as an example for description, but it is not limited to this.

Figure 5:
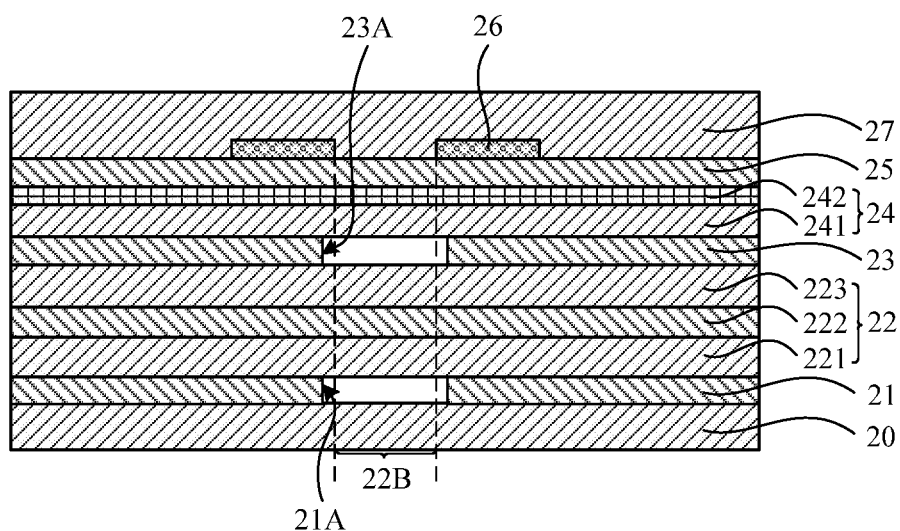
FIG. 5 is a schematic structural diagram of the display device obtained in a step S205 of the manufacturing method according to embodiment 2 of the present disclosure.
Figure 6:
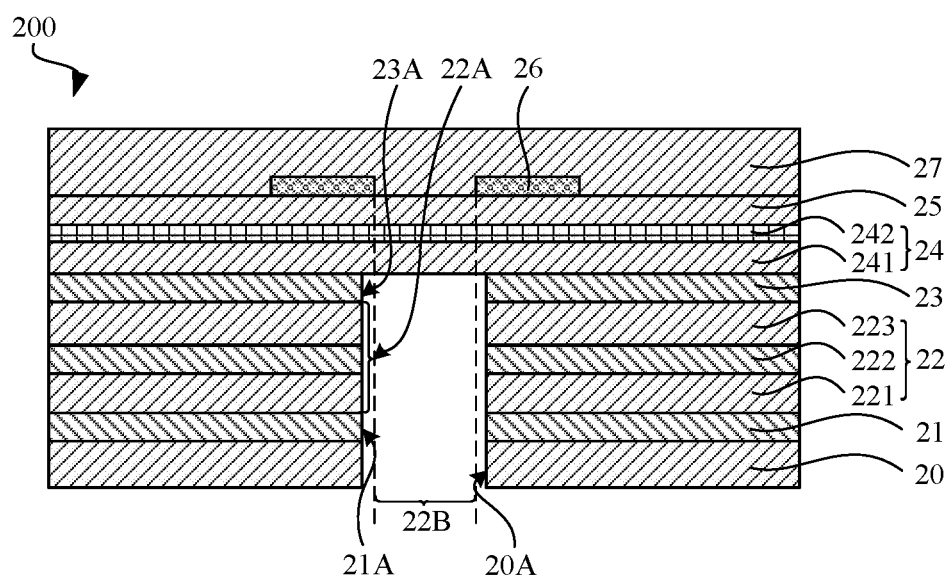
FIG. 6 is a schematic structural diagram of the display device obtained by the manufacturing method according to embodiment 2 of the present disclosure.

Refer to FIGS. 4 to 6. FIG. 5 is a schematic structural diagram of the display device obtained in the step S205 of the manufacturing method according to embodiment 2 of the present disclosure, and FIG. 6 is a schematic structural diagram of the display device obtained by the manufacturing method according to embodiment 2 of the present disclosure.

The manufacturing method of the display device 200 provided by embodiment 2 of the present disclosure will be described in detail below.

Step S201: providing the display module 22, the first optical adhesive layer 23, and the touch control structure layer 24. Wherein, the display module 22 includes the light transmission region 22B, and the first optical adhesive layer 23 is provided with the first through-hole 23A.

Specifically, the display module 22 includes an array substrate 221, a light-emitting functional layer 222, and a polarizer 223 formed in sequence. The polarizer 223 is disposed on one side of the light-emitting functional layer 222 adjacent to the first optical adhesive layer 23.

The touch control structure layer 24 includes a substrate layer 241 and a touch control functional layer 242 formed in sequence. A material of the substrate layer 241 includes polyethylene terephthalate. A material of the touch control functional layer 242 includes nano silver.

It can be understood that in current technology, during a process of opening holes on display screens using laser cutting, when a laser energy is greater than an ablation threshold value of polyethylene terephthalate, the substrate layer of a touch control structure is easily affected by laser and damaged, thereby affecting the touch control functional layer on the substrate layer. Since the touch control functional layer is thinner, touch control functions will be directly affected and lose effectiveness. Therefore, in order to prevent the substrate layer in the touch control structure layer from being damaged by the laser, the laser energy is generally set to be less than the ablation threshold value of polyethylene terephthalate.

However, since an ablation threshold value of optical adhesive is greater than the ablation threshold value of polyethylene terephthalate, when the first optical adhesive layer is cut by laser, a portion of the first optical adhesive layer corresponding to the light transmission region cannot be completely vaporized, thereby causing a hole-opening position of the first optical adhesive layer to have optical adhesive residues.

In response to the above technical problems, embodiment 2 of the present disclosure pre-opens the first through-hole 23A on the first optical adhesive layer 23. Therefore, when the laser having energy less than the ablation threshold value of polyethylene terephthalate is subsequently used to cut the portion of the backplate 20 and the display module 22 corresponding to the light transmission region 22B, since the portion of the first optical adhesive layer 23 corresponding to the light transmission region 22B is a hollowed-out structure, the optical adhesive residues caused by laser cutting can be effectively prevented, and the viewing angle range of the cameras can be ensured.

Wherein, the step of providing the first optical adhesive layer 23 includes:

cutting the first optical adhesive layer 23 according to a shape and a size of the light transmission region 22B to form the first optical adhesive layer 23 having the first through-hole 23A.

Specifically, the first optical adhesive layer 23 is cut by laser cutting process or mechanical cutting process, thereby forming the first optical adhesive layer 23 having the first through-hole 23A. In embodiment 2, the first optical adhesive layer 23 having the first through-hole 23A is formed by the laser cutting process, which is beneficial for improving cutting accuracy, thereby preventing incomplete cutting and affecting lighting of the cameras. Then proceed to the step S202.

Step S202: providing the backplate 20 and the adhesive layer 21. Wherein, the adhesive layer 21 is provided with the third through-hole 21A.

Wherein, a substrate of the backplate 20 may be a flexible material or a rigid material. A material of the adhesive layer 21 is a pressure sensitive adhesive.

It can be understood that since an ablation threshold value of the pressure sensitive adhesive is greater than the ablation threshold value of polyethylene terephthalate, in current technology, when the adhesive layer is cut by laser, a portion of the adhesive layer corresponding to the light transmission region cannot be completely vaporized, thereby causing a hole-opening position of the adhesive layer to have adhesive residues.

In response to the above technical problems, embodiment 2 of the present disclosure pre-opens the third through-hole 21A on the adhesive layer 21. Therefore, when the laser having energy less than the ablation threshold value of polyethylene terephthalate is subsequently used to cut the portion of the backplate 20 and the display module 22 corresponding to the light transmission region 22B, since the portion of the adhesive layer 21 corresponding to the light transmission region 22B is a hollowed-out structure, the adhesive residues caused by laser cutting can be effectively prevented, and the viewing angle range of the cameras can be further ensured.

Specifically, the adhesive layer 21 is cut according to the shape and the size of the light transmission region 22B to form the adhesive layer 21 having the third through-hole 21A.

Wherein, the adhesive layer 21 is cut by laser cutting process or mechanical cutting process, thereby forming the adhesive layer 21 having the third through-hole 21A. In embodiment 2, the adhesive layer 21 having the third through-hole 21A is formed by the laser cutting process, which is beneficial for improving cutting accuracy, thereby preventing incomplete cutting and affecting lighting of the cameras. Then proceed to the step S203.

Step S203: attaching the adhesive layer 21 and the display module 22 to the backplate 20 in sequence. Wherein, the third through-hole 21A corresponds to the light transmission region 22B.

Wherein, the array substrate 221 of the display module 22 is attached to the adhesive layer 21, and the third through-hole 21A is arranged corresponding to the light transmission region 22B. Then proceed to the step S204.

Step S204: attaching the first optical adhesive layer 23 and the touch control structure layer 24 onto the display module 22 in sequence. Wherein, the first through-hole 23A corresponds to the light transmission region 22B.

Specifically, the first optical adhesive layer 23 and the touch control structure layer 24 are attached to the polarizer 223 of the display module 22 in sequence, and the first through-hole 23A is arranged corresponding to the light transmission region 22B. Then proceed to the step S205.

Step S205: forming the second optical adhesive layer 25, the shading ring 26, and the protective layer 27 on the touch control structure layer 24 in sequence, as shown in FIG. 5.

Specifically, the step S205 includes following steps:

Step S2051: forming the second optical adhesive layer 25 on the touch control structure layer 24.

Step S2052: disposing the shading ring 26 on the second optical adhesive layer 25. Wherein, the shading ring 26 is coaxially arranged with the first through-hole 23A. Specifically, an orthographic projection of the first through-hole 23A on a plane where the display module 22 is located is within an orthographic projection of the shading ring 26 on the plane where the display module 22 is located. Wherein, a material of the shading ring 26 may be light-shielding materials, such as a black ink or a light-shielding adhesive.

Step S2053: forming the protective layer 27 on the shading ring 26 to obtain a structure shown in FIG. 5. Wherein, a material of the protective layer 27 may be an organic material such as polyethylene terephthalate. Then proceed to the step S206.

Step S206: using laser to cut the portion of the backplate 20 and the display module 22 corresponding to the light transmission region 22B to form the fourth through-hole 20A on the backplate 20 and form the second through-hole 22A on the display module 22. Wherein, the fourth through-hole 20A is connected to the second through-hole 22A, as shown in FIG. 6.

Specifically, the step S206 includes following steps:

Step S2061: setting laser cutting parameters. Wherein, the laser cutting parameters include a laser cutting power, a laser cutting time, and a number of turns of laser cutting track.

Step S2062: cutting the portion of the backplate 20 and the display module 22 corresponding to the light transmission region 22B according to the laser cutting parameters to form the fourth through-hole 20A on the backplate 20 and form the second through-hole 22A on the display module 22. Wherein, the fourth through-hole 20A is connected to the second through-hole 22A.

Specifically, since the portion of the first optical adhesive layer 23 corresponding to the light transmission region 22B is pre-opened and provided with the first through-hole 23A, when the backplate 20 and the display module 22 are cut by laser, the laser beam can be ended at an interface between the polarizer 223 and the first optical adhesive layer 23 by settings of the laser cutting parameters, thereby controlling a laser cutting depth. In addition, since an area where the first through-hole 23A is located is a heat affected area during laser cutting, the substrate layer 241 on the first optical adhesive layer 23 can be further prevented from being damaged by the laser beam.

The manufacturing method of the display device 200 provided by embodiment 2 of the present disclosure pre-opens the first through-hole 23A and the third through-hole 21A respectively on the first optical adhesive layer 23 and the adhesive layer 21, and then laminates the backplate 20, the adhesive layer 21, the display module 22, the first optical adhesive layer 23, and the touch control structure layer 24 in sequence. Therefore, when using laser to cut the portion of the backplate 20 and the display module 22 corresponding to the light transmission region 22B, since the portion of the first optical adhesive layer 23 and the adhesive layer 21 corresponding to the light transmission region 22B respectively have the first through-hole 23A and the third through-hole 21A, the optical adhesive residues and adhesive residues in the adhesive layer 21 caused by laser cutting can be prevented, and the viewing angle range of the cameras can be ensured. In addition, the above settings can also realize control of the laser cutting depth, which further prevents the substrate layer 241 on the first optical adhesive layer 23 from being damaged by the laser beam.

Figure 7:
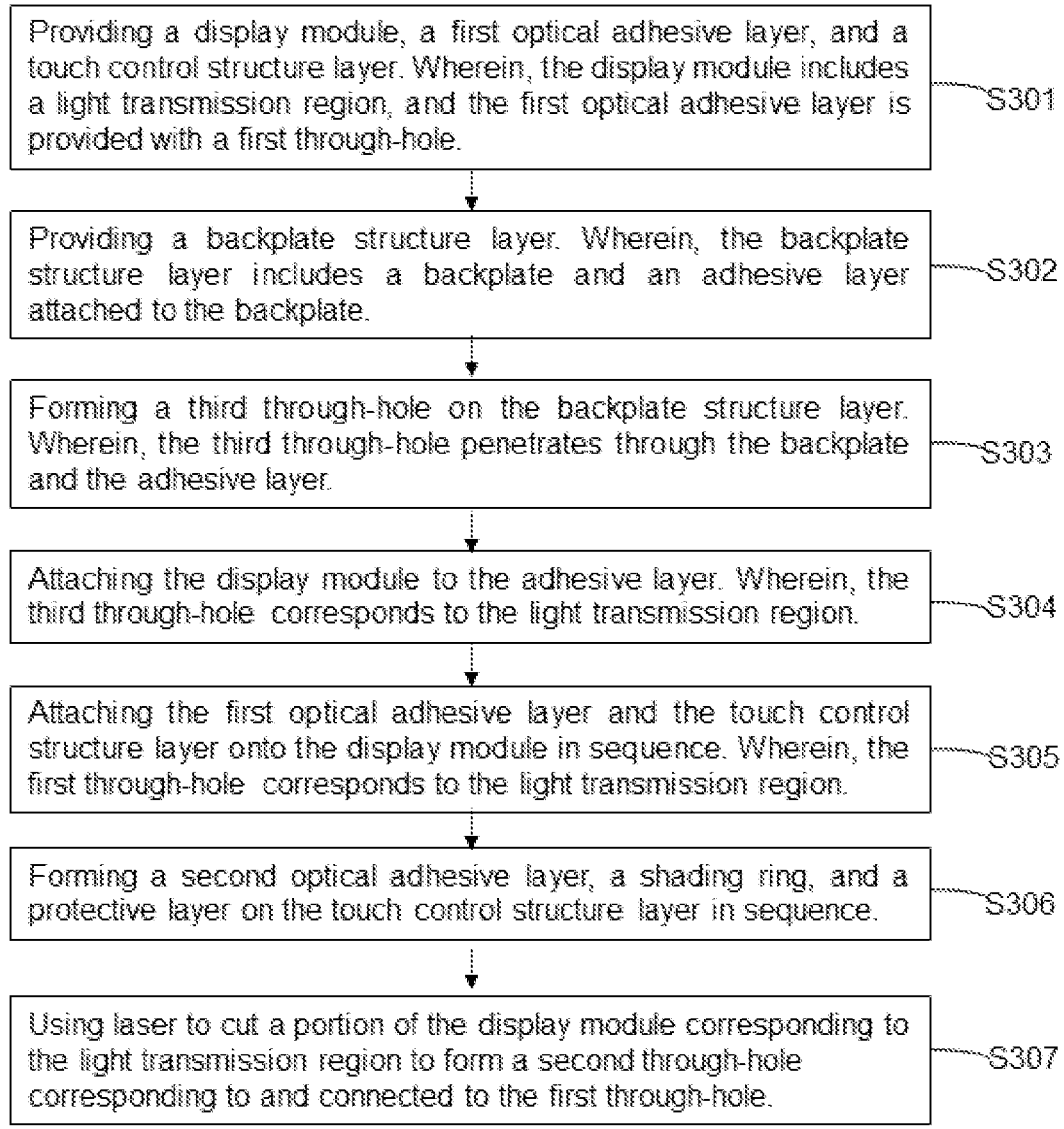
FIG. 7 is a flowchart of a manufacturing method of a display device according to embodiment 3 of the present disclosure.

Referring to FIG. 7, FIG. 7 is a flowchart of a manufacturing method of a display device according to embodiment 3 of the present disclosure.

Embodiment 3 of the present disclosure provides the manufacturing method of the display device, which includes following steps.

Step S301: providing a display module, a first optical adhesive layer, and a touch control structure layer. Wherein, the display module includes a light transmission region, and the first optical adhesive layer is provided with a first through-hole.

Step S302: providing a backplate structure layer. Wherein, the backplate structure layer includes a backplate and an adhesive layer attached to the backplate.

Step S303: forming a third through-hole on the backplate structure layer. Wherein, the third through-hole penetrates through the backplate and the adhesive layer.

Step S304: attaching the display module to the adhesive layer.

Wherein, the third through-hole corresponds to the light transmission region.

Step S305: attaching the first optical adhesive layer and the touch control structure layer onto the display module in sequence. Wherein, the first through-hole corresponds to the light transmission region.

Step S306: forming a second optical adhesive layer, a shading ring, and a protective layer on the touch control structure layer in sequence.

Step S307: using laser to cut a portion of the display module corresponding to the light transmission region to form a second through-hole corresponding to and connected to the first through-hole.

As such, the manufacturing method of the display device provided by embodiment 3 of the present disclosure pre-opens the first through-hole and the third through-hole respectively on the first optical adhesive layer and the backplate structure layer, and then laminates the backplate structure layer, the display module, the first optical adhesive layer, and the touch control structure layer in sequence. Therefore, when using laser to cut a portion of the display module corresponding to the light transmission region, since a portion of the first optical adhesive layer and the backplate structure layer corresponding to the light transmission region respectively have the first through-hole and the third through-hole, optical adhesive residues and material residues of the backplate structure layer caused by laser cutting can be prevented, and a viewing angle range of cameras can be further ensured.

It should be noted that the steps S302 to S304 of embodiment 3 may be before the step S305 or after the step S305, and embodiment 3 of the present disclosure only takes the steps S302 to S304 before the step S305 as an example for description, but it is not limited to this.

Figure 8:
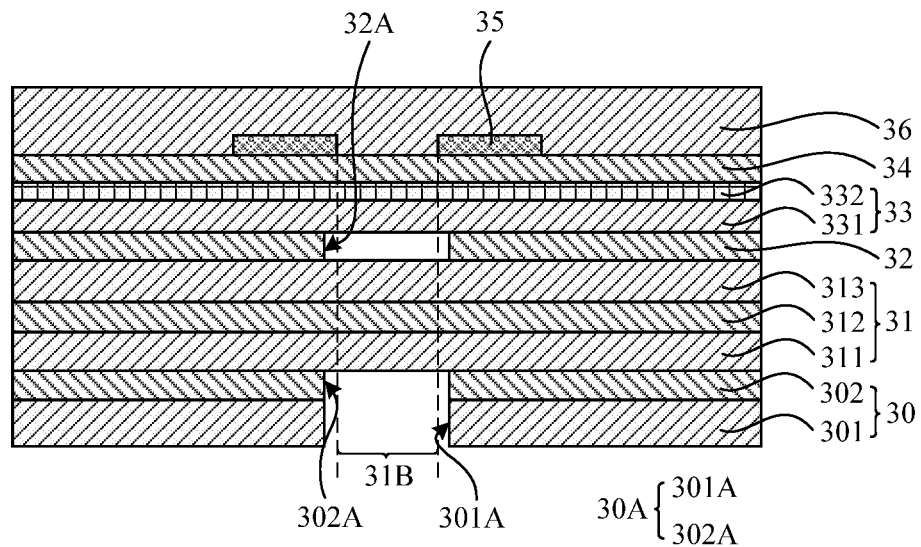
FIG. 8 is a schematic structural diagram of the display device obtained in a step S306 of the manufacturing method according to embodiment 3 of the present disclosure.
Figure 9:
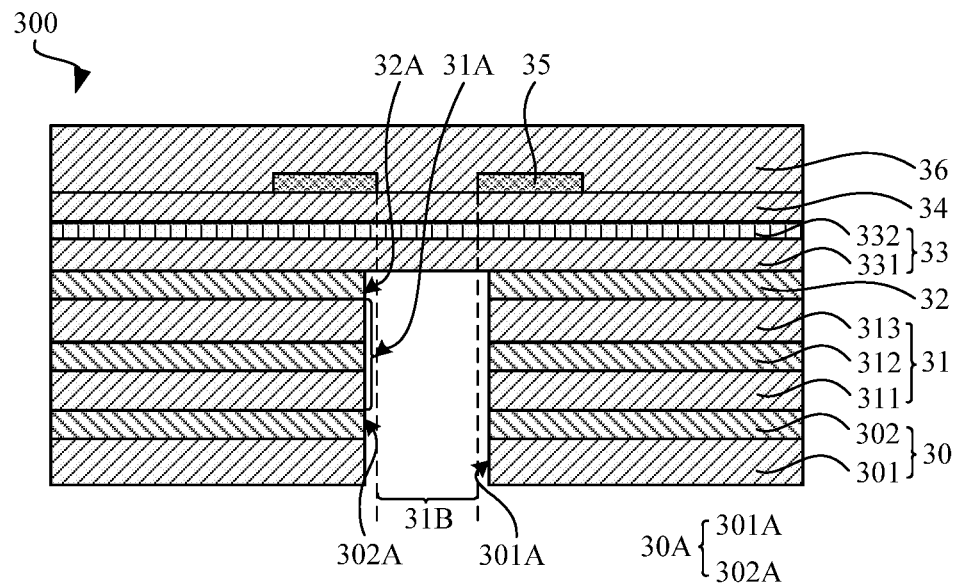
FIG. 9 is a schematic structural diagram of the display device obtained by the manufacturing method according to embodiment 3 of the present disclosure.

Refer to FIGS. 7 to 9. FIG. 8 is a schematic structural diagram of the display device obtained in the step S306 of the manufacturing method according to embodiment 3 of the present disclosure, and FIG. 9 is a schematic structural diagram of the display device obtained by the manufacturing method according to embodiment 3 of the present disclosure.

The manufacturing method of the display device 300 provided by embodiment 3 of the present disclosure will be described in detail below.

Step S301: providing the display module 31, the first optical adhesive layer 32, and the touch control structure layer 33. Wherein, the display module 31 includes the light transmission region 31B, and the first optical adhesive layer 32 is provided with the first through-hole 32A.

Specifically, the display module 31 includes an array substrate 311, a light-emitting functional layer 312, and a polarizer 313 formed in sequence. The polarizer 313 is disposed on one side of the light-emitting functional layer 312 adjacent to the first optical adhesive layer 32.

The touch control structure layer 33 includes a substrate layer 331 and a touch control functional layer 332 formed in sequence. A material of the substrate layer 331 includes polyethylene terephthalate. A material of the touch control functional layer 332 includes nano silver.

It can be understood that in current technology, during a process of opening holes on display screens using laser cutting, when a laser energy is greater than an ablation threshold value of polyethylene terephthalate, the substrate layer of a touch control structure is easily affected by laser and damaged, thereby affecting the touch control functional layer on the substrate layer. Since the touch control functional layer is thinner, touch control functions will be directly affected and lose effectiveness. Therefore, in order to prevent the substrate layer in the touch control structure layer from being damaged by the laser, the laser energy is generally set to be less than the ablation threshold value of polyethylene terephthalate.

However, since an ablation threshold value of optical adhesive is greater than the ablation threshold value of polyethylene terephthalate, when the first optical adhesive layer is cut by laser, a portion of the first optical adhesive layer corresponding to the light transmission region cannot be completely vaporized, thereby causing a hole-opening position of the first optical adhesive layer to have optical adhesive residues.

In response to the above technical problems, embodiment 3 of the present disclosure pre-opens the first through-hole 32A on the first optical adhesive layer 32. Therefore, when the laser having energy less than the ablation threshold value of polyethylene terephthalate is subsequently used to cut the portion of the display module 31 corresponding to the light transmission region 31B, since the portion of the first optical adhesive layer 32 corresponding to the light transmission region 31B is a hollowed-out structure, the optical adhesive residues caused by laser cutting can be effectively prevented, and the viewing angle range of the cameras can be ensured.

Wherein, the step of providing the first optical adhesive layer 32 includes:

cutting the first optical adhesive layer 32 according to a shape and a size of the light transmission region 31B to form the first optical adhesive layer 32 having the first through-hole 32A.

Specifically, the first optical adhesive layer 32 is cut by laser cutting process or mechanical cutting process, thereby forming the first optical adhesive layer 32 having the first through-hole 32A. In embodiment 3, the first optical adhesive layer 32 having the first through-hole 32A is formed by the laser cutting process, which is beneficial for improving cutting accuracy, thereby preventing incomplete cutting and affecting lighting of the cameras. Then proceed to the step S302.

Step S302: providing the backplate structure layer 30. Wherein, the backplate structure layer 30 includes the backplate 301 and the adhesive layer 302 attached to the backplate 301.

Wherein, a substrate of the backplate 301 may be a flexible material or a rigid material. A material of the adhesive layer 302 is a pressure sensitive adhesive. Then proceed to the step S303.

Step S303: forming the third through-hole 30A on the backplate structure layer 30. Wherein, the third through-hole penetrates through the backplate 301 and the adhesive layer 302.

It can be understood that since ablation threshold values of the flexible material of the backplate and the pressure sensitive adhesive of the adhesive layer are greater than the ablation threshold value of polyethylene terephthalate, when the backplate structure layer is cut by laser, a portion of the backplate structure layer corresponding to the light transmission region cannot be completely vaporized, thereby causing a hole-opening position of the backplate structure layer to have residues of the flexible material and the pressure sensitive adhesive.

In response to the above technical problems, embodiment 3 of the present disclosure pre-opens the third through-hole 30A on the backplate structure layer 30. Therefore, when the laser is subsequently used to cut the portion of the display module 31 corresponding to the light transmission region 31B, since the portion of the backplate structure layer 30 corresponding to the light transmission region 31B is a hollowed-out structure, the residues of the flexible material and the pressure sensitive adhesive in the backplate structure layer 30 caused by laser cutting can be effectively prevented, and the viewing angle range of the cameras can be further ensured.

Specifically, the step S303 includes following steps.

Step S3031: cutting the adhesive layer 302 according to the shape and the size of the light transmission region 31B to form a first sub-through-hole 302A.

Step S3032: cutting the backplate 301 according to the shape and the size of the light transmission region 31B to form a second sub-through-hole 301A. Wherein, the second sub-through-hole 301A is connected to the first sub-through-hole 302A to form the third through-hole 30A of the backplate structure layer 30.

In the step S3031, the adhesive layer 302 is cut by laser cutting process or mechanical cutting process, thereby forming the first sub-through-hole 302A. In embodiment 3, the first sub-through-hole 302A is formed by the laser cutting process, which is beneficial for improving cutting accuracy, thereby preventing incomplete cutting and affecting lighting of the cameras.

In the step S3032, the backplate 301 is cut by laser cutting process or mechanical cutting process, thereby forming the second sub-through-hole 301A. In embodiment 3, the second sub-through-hole 301A is formed by the laser cutting process, which is beneficial for improving cutting accuracy, thereby preventing incomplete cutting and affecting lighting of the cameras. Then proceed to the step S304.

Step S304: attaching the display module 31 to the adhesive layer 302. Wherein, the third through-hole 30A corresponds to the light transmission region 31B.

Wherein, the array substrate 311 of the display module 31 is attached to the adhesive layer 302, and the third through-hole 30A is arranged corresponding to the light transmission region 31B. Then proceed to the step S305.

Step S305: attaching the first optical adhesive layer 32 and the touch control structure layer 33 onto the display module 31 in sequence. Wherein, the first through-hole 32A corresponds to the light transmission region 31B.

Specifically, the first optical adhesive layer 32 and the touch control structure layer 33 are attached onto the display module 31 in sequence, and the first through-hole 32A is arranged corresponding to the light transmission region 31B. Then proceed to the step S306.

Step S306: forming the second optical adhesive layer 34, the shading ring 35, and the protective layer 36 on the touch control structure layer 33 in sequence, as shown in FIG. 8.

Specifically, the step S306 includes following steps.

Step S3061: forming the second optical adhesive layer 34 on the touch control structure layer 33.

Step S3062: disposing the shading ring 35 on the second optical adhesive layer 34. Wherein, the shading ring 35 is coaxially arranged with the first through-hole 32A. Specifically, an orthographic projection of the first through-hole 32A on a plane where the display module 31 is located is within an orthographic projection of the shading ring 35 on the plane where the display module 31 is located. Wherein, a material of the shading ring 35 may be light-shielding materials, such as a black ink or a light-shielding adhesive.

Step S3063: forming the protective layer 36 on the shading ring 35 to obtain a structure shown in FIG. 8. Wherein, a material of the protective layer 36 may be an organic material such as polyethylene terephthalate. Then proceed to the step S307.

Step S307: using laser to cut the portion of the display module 31 corresponding to the light transmission region 31B to form the second through-hole 31A corresponding to and connected to the first through-hole 32A as shown in FIG. 9.

Specifically, the step S307 includes following steps.

Step S3071: setting laser cutting parameters. Wherein, the laser cutting parameters include a laser cutting power, a laser cutting time, and a number of turns of laser cutting track.

Step S3072: cutting the portion of the display module 31 corresponding to the light transmission region 31B according to the laser cutting parameters to form the second through-hole. Wherein, the second through-hole is correspondingly connected to the first through-hole 32A.

Specifically, since the portion of the first optical adhesive layer 32 corresponding to the light transmission region 31B is pre-opened and provided with the first through-hole 32A, when the display module 31 is cut by laser, the laser beam can be ended at an interface between the polarizer 313 and the first optical adhesive layer 32 by settings of the laser cutting parameters, thereby controlling a laser cutting depth. In addition, since an area where the first through-hole 32A is located is a heat affected area during laser cutting, the substrate layer 331 on the first optical adhesive layer 32 can be further prevented from being damaged by the laser beam.

The manufacturing method of the display device 300 provided by embodiment 3 of the present disclosure pre-opens the first through-hole 32A and the third through-hole 30A respectively on the first optical adhesive layer 32 and the backplate structure layer 30, and then laminates the backplate structure layer 30, the display module 31, the first optical adhesive layer 32, and the touch control structure layer 33 in sequence. Therefore, when using laser to cut the portion of the display module 31 corresponding to the light transmission region 31B, since the portion of the first optical adhesive layer 32 and the backplate structure layer 30 corresponding to the light transmission region 31B respectively have the first through-hole 32A and the third through-hole 30A, the optical adhesive residues and the material residues of the backplate structure layer 30 caused by laser cutting can be prevented, and the viewing angle range of the cameras can be further ensured. In addition, the above settings can also realize control of the laser cutting depth, which further prevents the substrate layer 331 on the first optical adhesive layer 32 from being damaged by the laser beam.

Compared to manufacturing methods of display devices in current technology, the manufacturing method of the display device provided by the present disclosure pre-opens the first through-hole on the first optical adhesive layer, and then laminates the display module, the first optical adhesive layer, and the touch control structure layer in sequence. Wherein, the first through-hole corresponds to the light transmission region. Therefore, when using laser to cut the portion of the display module corresponding to the light transmission region, since the portion of the first optical adhesive layer corresponding to the light transmission region has the first through-hole, the optical adhesive residues caused by laser cutting can be effectively prevented, and the viewing angle range of the cameras can be ensured.

The embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A manufacturing method of a display device, comprising following steps:
   providing a display module, a first optical adhesive layer, and a touch control structure layer, wherein the display module comprises a light transmission region, the first optical adhesive layer is provided with a first through-hole, the display module comprises an array substrate, a light-emitting functional layer, and a polarizer formed in sequence, and the polarizer is disposed on one side of the light-emitting functional layer adjacent to the first optical adhesive layer;
   attaching the first optical adhesive layer and the touch control structure layer onto the display module in sequence, wherein the first through-hole corresponds to the light transmission region, and the touch control structure layer comprises a substrate layer and a touch control functional layer formed in sequence; and
   using laser to cut a portion of the display module corresponding to the light transmission region to form a second through-hole corresponding to and connected to the first through-hole.

2. The manufacturing method of the display device according to claim 1, wherein the step of providing the first optical adhesive layer comprises:
   cutting the first optical adhesive layer according to a shape and a size of the light transmission region to form the first optical adhesive layer having the first through-hole.

3. The manufacturing method of the display device according to claim 1, wherein before or after the step of attaching the first optical adhesive layer and the touch control structure layer onto the display module in sequence, the manufacturing method comprises following steps:
   providing a backplate structure layer, wherein the backplate structure layer comprises a backplate and an adhesive layer attached to the backplate;

forming a third through-hole on the backplate structure layer, wherein the third through-hole penetrates through the backplate and the adhesive layer; and attaching the display module to the adhesive layer, wherein the third through-hole corresponds to the light transmission region.

4. The manufacturing method of the display device according to claim 3, wherein the step of forming the third through-hole on the backplate structure layer comprises following steps:

cutting the adhesive layer according to a shape and a size of the light transmission region to form a first sub-through-hole; and cutting the backplate according to the shape and the size of the light transmission region to form a second sub-through-hole, wherein the second sub-through-hole is connected to the first sub-through-hole to form the third through-hole of the backplate structure layer.

5. The manufacturing method of the display device according to claim 1, wherein before or after the step of attaching the first optical adhesive layer and the touch control structure layer onto the display module in sequence, the manufacturing method comprises following steps:

providing a backplate and an adhesive layer, wherein the adhesive layer is provided with a third through-hole;

attaching the adhesive layer and the display module to the backplate in sequence, wherein the third through-hole corresponds to the light transmission region; and the step of using laser to cut the portion of the display module corresponding to the light transmission region comprises:

using laser to cut a portion of the backplate and the display module corresponding to the light transmission region to form a fourth through-hole on the backplate and form the second through-hole on the display module, wherein the fourth through-hole is connected to the second through-hole.

6. The manufacturing method of the display device according to claim 1, wherein before or after the step of attaching the first optical adhesive layer and the touch control structure layer onto the display module in sequence, the manufacturing method comprises following steps:

providing a backplate structure layer, wherein the backplate structure layer comprises a backplate and an adhesive layer attached to the backplate;

attaching the display module to the adhesive layer; and the step of using laser to cut the portion of the display module corresponding to the light transmission region comprises:

using laser to cut a portion of the backplate structure layer and the display module corresponding to the light transmission region to form a third through-hole on the backplate structure layer and form the second through-hole on the display module, wherein the second through-hole, the third through-hole, and the first through-hole are connected.

7. The manufacturing method of the display device according to claim 1, wherein the step of using laser to cut the portion of the display module corresponding to the light transmission region to form the second through-hole comprises following steps:

setting laser cutting parameters, wherein the laser cutting parameters comprise a laser cutting power, a laser cutting time, and a number of turns of laser cutting track; and cutting the portion of the display module corresponding to the light transmission region according to the laser cutting parameters to form the second through-hole.

8. The manufacturing method of the display device according to claim 1, wherein a material of the substrate layer comprises polyethylene terephthalate.

9. The manufacturing method of the display device according to claim 1, wherein after the step of attaching the first optical adhesive layer and the touch control structure layer onto the display module in sequence, the manufacturing method comprises following steps:

forming a second optical adhesive layer on the touch control structure layer;

disposing a shading ring on the second optical adhesive layer, wherein the shading ring is coaxially arranged with the first through-hole; and forming a protective layer on the shading ring.

10. A manufacturing method of a display device, comprising following steps:

providing a display module, a first optical adhesive layer, and a touch control structure layer, wherein the display module comprises a light transmission region, and the first optical adhesive layer is provided with a first through-hole;

attaching the first optical adhesive layer and the touch control structure layer onto the display module in sequence, wherein the first through-hole corresponds to the light transmission region; and using laser to cut a portion of the display module corresponding to the light transmission region to form a second through-hole corresponding to and connected to the first through-hole.

11. The manufacturing method of the display device according to claim 10, wherein the step of providing the first optical adhesive layer comprises:

cutting the first optical adhesive layer according to a shape and a size of the light transmission region to form the first optical adhesive layer having the first through-hole.

12. The manufacturing method of the display device according to claim 10, wherein before or after the step of attaching the first optical adhesive layer and the touch control structure layer onto the display module in sequence, the manufacturing method comprises following steps:

providing a backplate structure layer, wherein the backplate structure layer comprises a backplate and an adhesive layer attached to the backplate;

forming a third through-hole on the backplate structure layer, wherein the third through-hole penetrates through the backplate and the adhesive layer; and attaching the display module to the adhesive layer, wherein the third through-hole corresponds to the light transmission region.

13. The manufacturing method of the display device according to claim 12, wherein the step of forming the third through-hole on the backplate structure layer comprises following steps:

cutting the adhesive layer according to a shape and a size of the light transmission region to form a first sub-through-hole; and cutting the backplate according to the shape and the size of the light transmission region to form a second sub-through-hole, wherein the second sub-through-hole is connected to the first sub-through-hole to form the third through-hole of the backplate structure layer.

14. The manufacturing method of the display device according to claim 10, wherein before or after the step of attaching the first optical adhesive layer and the touch control structure layer onto the display module in sequence, the manufacturing method comprises following steps:
- providing a backplate and an adhesive layer, wherein the adhesive layer is provided with a third through-hole;
- attaching the adhesive layer and the display module to the backplate in sequence, wherein the third through-hole corresponds to the light transmission region; and
- the step of using laser to cut the portion of the display module corresponding to the light transmission region comprises:
- using laser to cut a portion of the backplate and the display module corresponding to the light transmission region to form a fourth through-hole on the backplate and form the second through-hole on the display module, wherein the fourth through-hole is connected to the second through-hole.

15. The manufacturing method of the display device according to claim 10, wherein before or after the step of attaching the first optical adhesive layer and the touch control structure layer onto the display module in sequence, the manufacturing method comprises following steps:
- providing a backplate structure layer, wherein the backplate structure layer comprises a backplate and an adhesive layer attached to the backplate;
- attaching the display module to the adhesive layer; and
- the step of using laser to cut the portion of the display module corresponding to the light transmission region comprises:
- using laser to cut a portion of the backplate structure layer and the display module corresponding to the light transmission region to form a third through-hole on the backplate structure layer and form the second through-hole on the display module, wherein the second through-hole, the third through-hole, and the first through-hole are connected.

16. The manufacturing method of the display device according to claim 10, wherein the step of using laser to cut the portion of the display module corresponding to the light transmission region to form the second through-hole comprises following steps:
- setting laser cutting parameters, wherein the laser cutting parameters comprise a laser cutting power, a laser cutting time, and a number of turns of laser cutting track; and
- cutting the portion of the display module corresponding to the light transmission region according to the laser cutting parameters to form the second through-hole.

17. The manufacturing method of the display device according to claim 10, wherein the touch control structure layer comprises a substrate layer and a touch control functional layer formed in sequence, and a material of the substrate layer comprises polyethylene terephthalate.

18. The manufacturing method of the display device according to claim 10, wherein after the step of attaching the first optical adhesive layer and the touch control structure layer onto the display module in sequence, the manufacturing method comprises following steps:
- forming a second optical adhesive layer on the touch control structure layer;
- disposing a shading ring on the second optical adhesive layer, wherein the shading ring is coaxially arranged with the first through-hole; and
- forming a protective layer on the shading ring.

19. The manufacturing method of the display device according to claim 10, wherein the display module comprises an array substrate, a light-emitting functional layer, and a polarizer formed in sequence, and the polarizer is disposed on one side of the light-emitting functional layer adjacent to the first optical adhesive layer.

* * * * *